(12) United States Patent
Samanta et al.

(10) Patent No.: US 7,676,782 B2
(45) Date of Patent: Mar. 9, 2010

(54) EFFICIENT METHOD FOR MAPPING A LOGIC DESIGN ON FIELD PROGRAMMABLE GATE ARRAYS

(76) Inventors: Dhabalendu Samanta, B 2/3, Glaxo Apartments, Mayur Vihar, Phase - I, Extn., Delhi (IN) 110-091; Viren Agarwal, 10$^{th}$ Mile, Rishi Road, Kalimpong, West Bengal (IN) 734301

( * ) Notice: Subject to any disclaimer, the term of this patent is extended or adjusted under 35 U.S.C. 154(b) by 527 days.

(21) Appl. No.: 11/319,015

(22) Filed: Dec. 27, 2005

(65) Prior Publication Data
US 2006/0190906 A1 Aug. 24, 2006

(30) Foreign Application Priority Data
Dec. 29, 2004 (IN) .................. 2595/DEL/2004

(51) Int. Cl.
*G06F 17/50* (2006.01)
*G06F 7/38* (2006.01)

(52) U.S. Cl. .................. 716/16; 716/10; 716/11; 716/17; 326/39; 326/41

(58) Field of Classification Search .......... 716/10, 716/11, 16; 703/19; 326/398, 39, 41; 257/678
See application file for complete search history.

(56) References Cited

U.S. PATENT DOCUMENTS

| | | | |
|---|---|---|---|
| 5,838,584 A | | 11/1998 | Kazarian |
| 6,185,724 B1 * | | 2/2001 | Ochotta .................. 716/16 |
| 6,216,257 B1 * | | 4/2001 | Agrawal et al. .......... 716/16 |
| 6,243,851 B1 | | 6/2001 | Hwang et al. |
| 6,289,496 B1 | | 9/2001 | Anderson et al. |
| 6,415,425 B1 | | 7/2002 | Chaudhary et al. |
| 6,480,954 B2 * | | 11/2002 | Trimberger et al. ........ 713/1 |
| 6,813,754 B2 * | | 11/2004 | Wu et al. ................ 716/10 |
| 6,879,922 B2 * | | 4/2005 | Hogle et al. ............. 702/98 |
| 7,000,210 B2 * | | 2/2006 | Wu et al. ................ 716/16 |
| 7,129,744 B2 * | | 10/2006 | Madurawe ............... 326/38 |
| 7,219,048 B1 * | | 5/2007 | Xu ...................... 703/19 |
| 7,239,175 B2 * | | 7/2007 | Madurawe ............... 326/38 |
| 7,265,577 B2 * | | 9/2007 | Madurawe ............... 326/38 |
| 7,266,632 B2 * | | 9/2007 | Dao et al. .............. 710/317 |
| 7,302,111 B2 * | | 11/2007 | Olsson et al. ........... 382/266 |
| 7,428,721 B2 * | | 9/2008 | Rohe et al. ............. 716/16 |
| 2005/0023656 A1 * | | 2/2005 | Leedy .................. 257/678 |
| 2005/0248365 A1 * | | 11/2005 | Chang ................... 326/39 |
| 2005/0278680 A1 * | | 12/2005 | Mukherjee et al. ........ 716/16 |
| 2007/0152707 A1 * | | 7/2007 | Madurawe ............... 326/38 |
| 2007/0164785 A1 * | | 7/2007 | He ...................... 326/41 |
| 2007/0198971 A1 * | | 8/2007 | Dasu et al. ............. 717/140 |

OTHER PUBLICATIONS

Du et al.; "A fast adaptive heuristic for FPGA placement"; Jun. 20-23, 2004; Circuits and Systems; NEWCAS 2004. The 2nd Annual IEEE Northeast Workshop on; pp. 373-376.*

(Continued)

*Primary Examiner*—Helen Rossoshek

(57) ABSTRACT

An efficient method for mapping a logic design on Field Programmable Gate Arrays involves a determination of the minimum required square grid of FPGA logic blocks for mapping the design, providing a compensation factor on the minimum square grids, selecting the maximum value among the compensated square grids for reducing the mapping time; and implementing a legalization adjustment to ensure mapping of said compensated design.

22 Claims, 5 Drawing Sheets

OTHER PUBLICATIONS

Jamro et al.; "Genetic programming in FPGA implementation of addition as a part of the convolution"; Sep. 4-6, 2001; Digital Systems, Design, 2001. Proceedings. Euromicro Symposium on; pp. 466-473.*

Wigley et al.; "The first real operating system for reconfigurable computers"; Jan. 29-30, 2001; Computer Systems Architecture Conference, ACSAC 2001. Proceedings. 6th Australasian; pp. 130-137.*

Alpert, et al. "Faster Minimization of Linear Wirelength for Global Placement"; ACM Sympo. On Physical Design; 1997; pp. 1-22.

Alpert, et al. "Quadratic Placement Revisited"; DAC; 1997.

Huang, et al. "Partitioning-Based Standard-Cell Global Placement with an Exact Objective"; ACM Symp. On Physical Design; 1997.

Alexander, et al. "Performance-Oriented Placement and Routing for Field-Programmable Gate Arrays"; European Design Automation Conf.; IEEE; 1995; pp. 80-85.

Huang, et al. "An Efficient General Cooling Schedule for Simulated Annealing"; ICCAD; IEEE, 1986; pp. 381-384.

Kirkpatrick, et al. "Optimization by Simulated Annealing,"; Science; May 13, 1983; pp. 671-680.

Lam et al. "Performance of a New Annealing Schedule"; DAC; IEEE; 1988; pp. 306-311.

Sun, et al. "Efficient and Effective Placement for Very Large Circuits"; IEEE Trans. On CAD; IEEE; Mar. 1995; pp. 349-359.

* cited by examiner

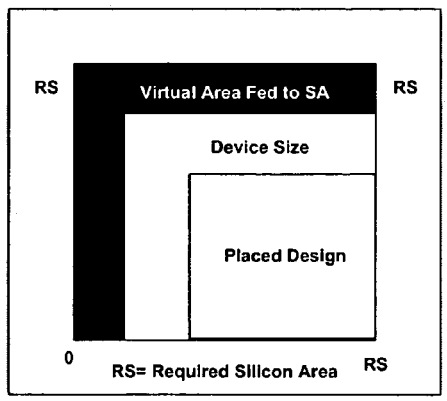
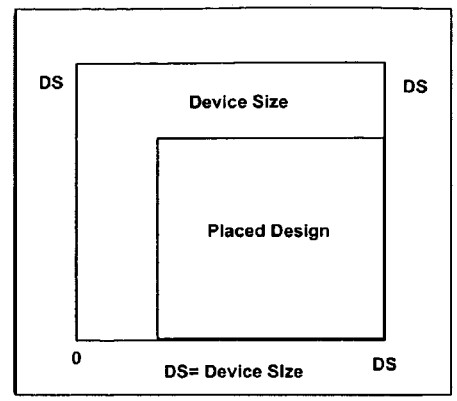
Figure 7
Figure 8
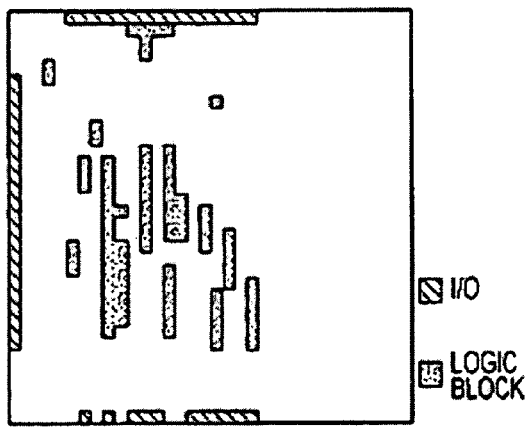
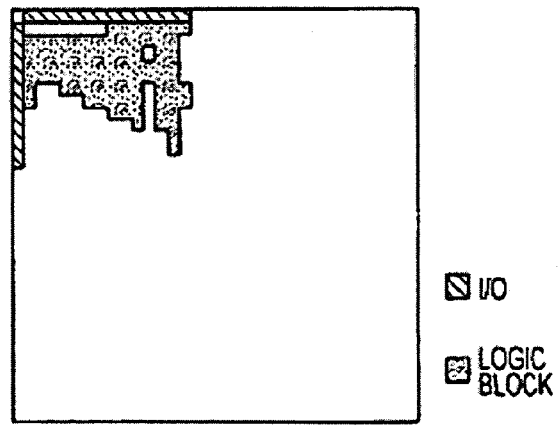
Figure 9
Figure 10

EFFICIENT METHOD FOR MAPPING A LOGIC DESIGN ON FIELD PROGRAMMABLE GATE ARRAYS

RELATED APPLICATION

The present application claims priority to Indian Patent Application No. 2595/Del/2004 filed Dec. 29, 2004, which is incorporated herein in its entirety by this reference.

BACKGROUND

Field Programmable Gate Arrays (FPGAs) are configurable logic devices, which are used to implement varied logic functions. The basic FPGA consists of Look Up Tables (LUTs) and routing paths but a complex one includes dedicated RAM, logic/I/O blocks and other macros like adders, multipliers etc. These FPGAs can be configured to produce a desired output by interconnecting said blocks through routing paths. This process of implementing logic of a design on a FPGA by interconnecting configurable logic devices is known as FPGA mapping. Since being first introduced by XILINX in 1985, the FPGAs have become increasingly popular devices for use in electronics systems. The use of FPGAs continues to grow exponentially because they offer relatively short design cycles, with huge reduction in costs through logic consolidation, and flexibility in terms of configurability.

Several FPGA placement systems have been developed to optimally implement the desired designs on a FPGA. The systems try to map the desired designs onto a grid of configurable logic blocks on a FPGA device of particular size. The net-list for the design, and the Input/Output pad (I/O pad) information of the chip are given as the inputs to the placement system and the system outputs the coordinates for each mapped logic element on a FPGA and interconnection information for logic elements. Over the last few decades, the FPGA placement problem has been solved by various techniques like analytic, partition based and Simulated Annealing. Two parameters of design cycle i.e., delay time and required Silicon area are optimized to get the best possible results. These systems also consider the mapping time and routability of the placed design while mapping the design on a FPGA.

Out of all techniques mentioned here, most FPGA placement systems are based on a variant of Simulated Annealing (SA) as SA usually results in most optimal solution in terms of silicon area and delay time. SA is a Monte Carlo approach for minimizing multivariate functions. The parameter involved in the case of placement is the cost of the placement in terms of wire length or some other factor. The temperature T is a parameter that controls the likelihood of accepting moves that makes the placement worse.

Initially T is very high so almost all moves are accepted. It is then gradually decreased, as the placement is refined so that eventually the probability of accepting moves that makes the placement worse is very low. To apply SA, the system is initialised with a particular random placement. A new placement is constructed by random displacement of the configurable logic devices. If the cost of this new state is lower than that of the previous one, the change is accepted unconditionally and the placement is updated. If the energy is greater, the new placement is accepted probabilistically. This is the Metropolis step, the fundamental procedure of SA. This procedure allows the system to move consistently towards lower cost, yet still 'jump' out of local minima due to the probabilistic acceptance of some upward moves.

While various FPGA configurations are currently used, the FPGA devices mentioned herein represent a square grid of configurable elements on a FPGA. For example, a FPGA with device size 17 represents a FPGA having a square grid of configurable logic blocks with 17 rows and 17 columns and routing paths in between. The square arrangement helps in ensuring minimization of wire length in a design and thus reducing the placement cost.

There are two inherent problems with these SA based placement systems. Firstly, when the design size is almost equivalent to the FPGA device size, the present day systems are unable to produce an optimal FPGA placement for large designs within a reasonable amount of time. This is because there is a limited free space available for movement of logic blocks and as a result, the system performs significant amount of switching of logic blocks to find an optimal placement. The other problem is the availability of excess free space for movement of logic blocks when the design size is much smaller than the device size. The larger the device size the more number of moves SA will make and as a result, the system would take more time to find optimal placement. This is observed in FIG. 1 and FIG. 2.

The graph of FIG. 1 gives a very clear idea about the behavior of SA. XorMux8 requires a minimum of device size 17[15×15 for Logic blocks and I/O's on periphery]. The placement cost of SA is low in the region between 25 and 38. For very high device size, when the logic blocks have excess space to move, the SA produces very bad results. Moreover the deviation in the results, or in other words the randomness of SA is also increased for higher device size. The graph has been computed taking an average of mapping cost of five runs for each value of device size. If a design were to run only once for each device size, the deviation would even be larger.

The extra silicon area given to the logic blocks is to allow the SA to have more "moves" in which only a single cell is involved (i.e. no swapping) during the initial phase. This will facilitate SA to have a better intermediate solution compare to one with inappropriate silicon area.

The larger the device size the more number of moves SA will make. For more number of moves SA would take more time. But it is found that SA takes more time for less number of moves and produce a sub-optimal solution when it has very little free silicon area to move i.e. when the design size is almost equal to the device size. This is illustrated in FIG. 2.

As seen in the graph of FIG. 2, the placement time decreases till the device size is around 24 and then increases again. When the device size is near 17 [minimum size for XorMux8] the logic blocks are very tightly packed and hence the each move of SA actually involves two logic blocks (i.e. swapping). As shown in FIG. 3 and FIG. 4 below, almost all moves in FIG. 3 will involve two or more logic blocks where as moves in FIG. 4 will mostly involve one logic block.

Ideally the system should produce an optimal FPGA mapping, but the mapping time for a design adversely affects the system output. As the time passes, the parameter T decreases for SA based systems and as result, the probability of accepting a worse placement also decreases. For big designs the system may accept a sub-optimal placement, as eventually the system may not be able to accept a worse output in the proximity. Hence, eventually the system accepts a sub-optimal placement as an output if better placement is not found in the proximity. The system placement results are illustrated in terms of placement cost and placement time for various device sizes in FIGS. 1 & 2 respectively. As observed, both parameters initially decrease as the FPGA device size increases. However, the parameters start to increase, as the device size gets significantly bigger than the design size.

Moreover, the deviation in the results, or in other words the randomness of the output is also increased for higher device size.

The miniaturization of semiconductor technology and increase in the number of logic elements in the present day designs has made the present FPGA mapping systems very slow and unreliable for producing feasible FPGA implementation. All existing techniques produce far from the optimal solution. The present day systems are very slow in providing optimal mapping and hence, are very undesirable for FPGA implementation of designs with large number of logic elements. To truly exploit FPGAs for rapid turn-around development and prototyping, placing of processing elements in proper locations of the device plays an important role in determining the delay and the silicon requirement for FPGA implementation of a design.

Hence, there is a need for systems that minimize the chip area and delay time for a design, and at the same time reduce the mapping time.

SUMMARY

Various embodiments provide a system that results in reduced silicon area for designs with large number of logic elements. Various embodiments provide a system that reduces the timing delay for the mapped design on an FPGA. Various embodiments reduce the time taken for mapping the above mentioned designs on an FPGA.

Various embodiments provide an efficient method for mapping a logic design on Field Programmable Gate Arrays. The method includes determining the minimum required square grid of FPGA logic blocks for mapping said design, providing a compensation factor on the minimum square grids, selecting the maximum value amongst the compensated square grids for reducing the placement time, and implementing a legalization adjustment to ensure mapping of said compensated design. In some embodiments, determining the minimum required square grid involves a determination of the minimum required number of FPGA logic blocks in a square grid for mapping corresponding design logic blocks, a determination of the minimum required number of FPGA logic blocks in a square grid for mapping corresponding design Input/Output blocks, a determination of the minimum required number of FPGA logic blocks in a square grid for mapping corresponding design macros.

In some embodiments, the compensation factor for the square grid for the design logic blocks is calculated by multiplying said square grid for the design logic blocks by a factor 'X', the compensation factor of the square grid for the design Input/Output blocks is calculated by multiplying the number of Input/Output blocks by a factor 'Y', and the compensation factor for the square grid for the design macros is calculated by multiplying the number of macro blocks with a factor 'Z'. In some embodiments 'X' ranges between 1.5 to 3, 'Y' is 1 when more than one I/O logic block is held in an Input/Output coordinate, and 'Y' is 1.2 when the Input/Output coordinate holds only one I/O logic block, and 'Z' is 1.2.

BRIEF DESCRIPTIONS OF THE DRAWINGS

The invention will be described with reference to the accompanying drawings.

Figure 5:
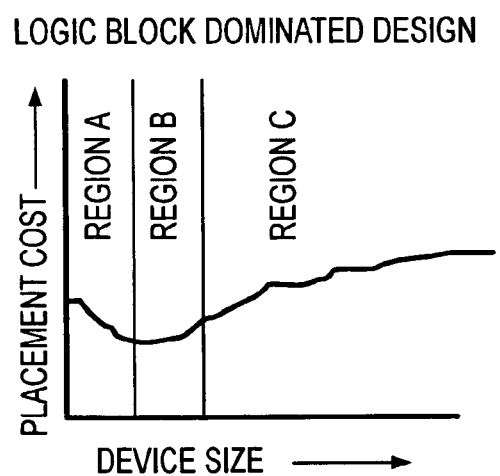
Figure 6:
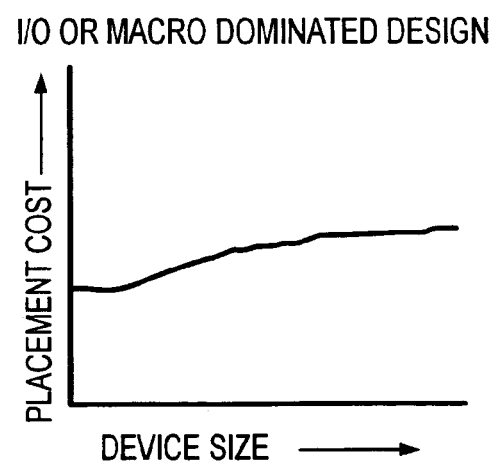

FIG. 5 shows the graph of logic block dominated design.
FIG. 6 shows the graph of I/O or macro dominated design.
FIGS. 7 and 8 show the device sizes.
FIGS. 9 to 13 show different simulation results.

DETAILED DESCRIPTION

To truly exploit FPGAs for rapid turn-around development and prototyping, placing of processing elements in proper locations of the device plays an important role in determining the delay and the silicon requirement for FPGA implementation of a design. Various embodiments provide a mapping system for efficient FPGA implementation of big designs. Based on the analysis in background, the mapping system determines the appropriate FPGA device size to place a design.

The Required Silicon area for each case is determined the following way.
 a) L=Required Silicon area for Logic Blocks=Square Root (Number of Logic Blocks).
 b) I=Required Silicon area for I/O's=I=(Number of I/O Cells required)/2.
 c) M=Required Silicon area for Macros=max (Maximum Height of Macro, Maximum Width of Macro).

To get the optimal required silicon area the behavior of the above three categories of designs is characterized. For Logic Block dominated designs with small differences between L and I, the behavior is as shown in FIG. 5. For I/O dominated designs having huge differences between L and I, the behavior is as shown in FIG. 6. For Macro dominated designs the behavior is as shown in FIG. 6 for designs where the difference between L and I is huge and similar to FIG. 5 where the difference between L and I is small.

In cases where the difference between L and I is small for I/O dominated designs or L and M is small for Macro dominated designs, the behavior is similar to FIG. 5 because in such cases the values of I or M lie in region A of FIG. 5. In other words, the Logic Blocks are still tightly packed due to the small difference between L and I for I/O dominated designs or L and M for Macro dominated designs. Hence, the logic blocks do not get enough free space to move.

Figure 1:
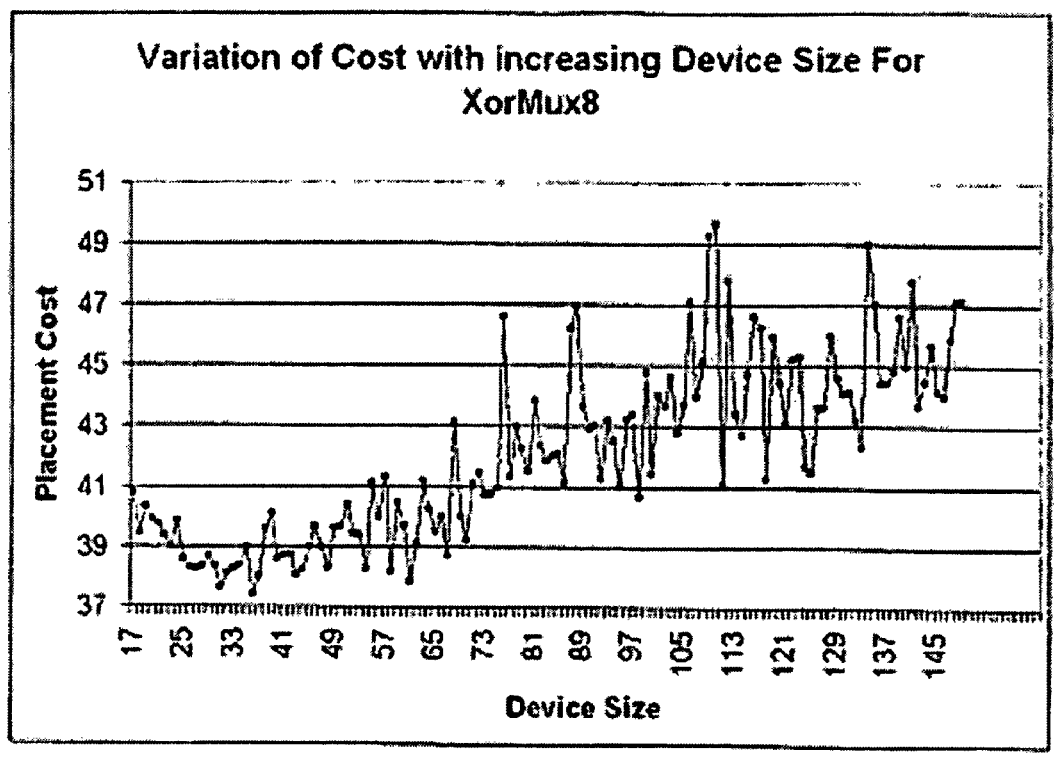
FIG. 1 shows the graph of placement cost versus device size.
Figure 2:
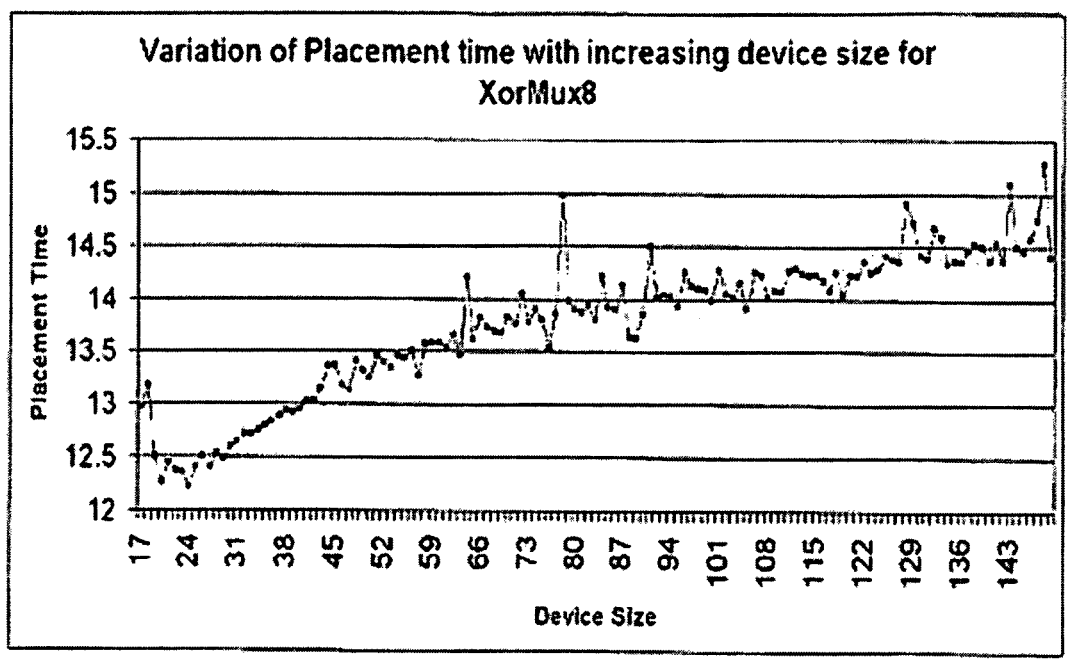
FIG. 2 shows the graph of variation of placement time with increasing device.
Figure 3:
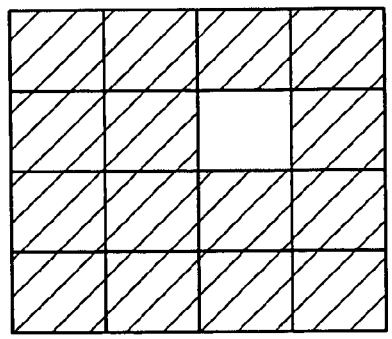
FIGS. 3 and 4 show the moves involving the logic blocks.
Figure 4:
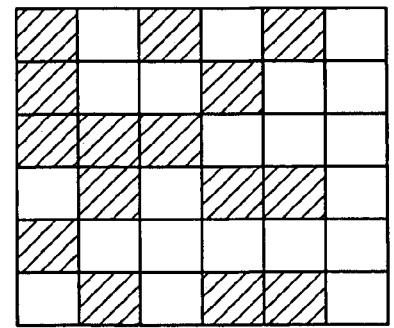

Therefore for all designs the target should be to achieve Region B. However due to the minimum space required for I/O dominated designs or Macro dominated designs, the device size in region B may not be sufficient to place all I/O's or satisfy the macro heights. In such a scenario a value in region C is chosen (the behavior in region C is similar to FIG. 6). Another parameter that plays an important role in choosing the optimal device size is the placement time. It is evident from FIG. 1 and FIG. 2 that the time increases in the second half of the region B. To get the optimal value of required silicon we compute the value of L, I and M according to the following procedure:
 A) Computing Value of $L_m$
  $L_m$=L*w, where the factor w can be in the range of 1.5 to 3.
 B) Computing Value $M_m$
  Twenty percent extra silicon area is given to Macros.
  Hence $M_m$=M*1.20
 C) Computing Value of $I_m$
  The computation of I depends on the architecture of the device.
  i) If a single I/O co-ordinate can hold more than one I/O, then I is not to be modified
  ii) If a single I/O co-ordinate holds only one I/O then twenty percent extra silicon area is given.
  Hence $I_m$=I*1.2.

The maximum value amongst the computed values of $L_m$, $I_m$ and $M_m$ is taken and set as the required silicon area for the design. Hence, Required Silicon for design=Rm=Max($L_m$, $I_m$, $M_m$)

The extra silicon area given to the logic blocks is to allow the SA to have more "moves" in which only a single cell is involved (i.e. no swapping) during the initial phase. This will facilitate SA to have a better intermediate solution compared to one with an inappropriate silicon area.

Re-Adjustment of Rm

The calculated required silicon area (Rm) may not be sufficient to place all macros. Also the $I_m$ value takes only two sides of I/O mapping into account. The I/O mapping on the other two sides is not calculated. Hence, some adjustments are done to the calculated required silicon value (Rm). The following two steps are further carried out:
1) A legalization algorithm is executed to find the minimum amount of device required to place all the macros without legalization.
   Hence ML=Legalization Value for macros.
2) The $I_m$ value is readjusted as $I_{Final}$=Min($I_{m,\ Device\ size}$). This is done to allow I/O's to use all the four sides of the device if the $I_m$ value exceeds the device size.
   Hence, Final Required Silicon for design=RS=Maximum ($R_m$, ML, $I_{final}$)

The required Silicon Area can exceed the device size. The SA apparatus would usually converge itself in such cases to an area supported by the device size. A post placement method may be required to set the logic block co-ordinates to valid co-ordinates with respect to the device size as shown in FIG. 7 and FIG. 8 below. As shown in FIG. 7 the placed design has co-ordinates from 0 to RS. Hence the entire placement needs to be shifted as shown in FIG. 8.

An example when a design may consume a larger area than the amount required by it is shown below. For example an area of 8×8 may be sufficient for a design fed to an SA based placer. But the SA initially maps it to the entire available chip area and then searches for the global optima in the entire device. This is demonstrated in the FIG. 9.

To overcome the problem outlined in FIG. 9 SA is prevented from using an area more than the calculated required silicon area as shown in FIG. 10. A large portion of silicon is not explored due to the restrictions set by the required silicon.

This helps in reducing the placement time and produces a near optimal solution as only the required silicon area is explored. Moreover, the maximum deviation in the output of the SA apparatus is less than the output generated using the require silicon area concept. Hence randomness of SA is also decreased.

Figure 11:
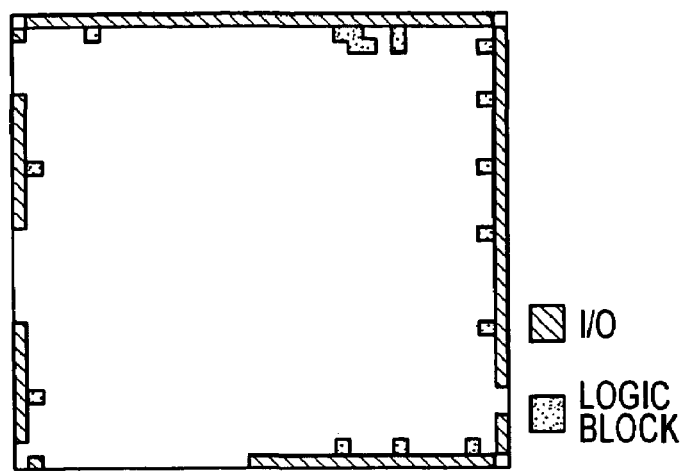
Figure 12:
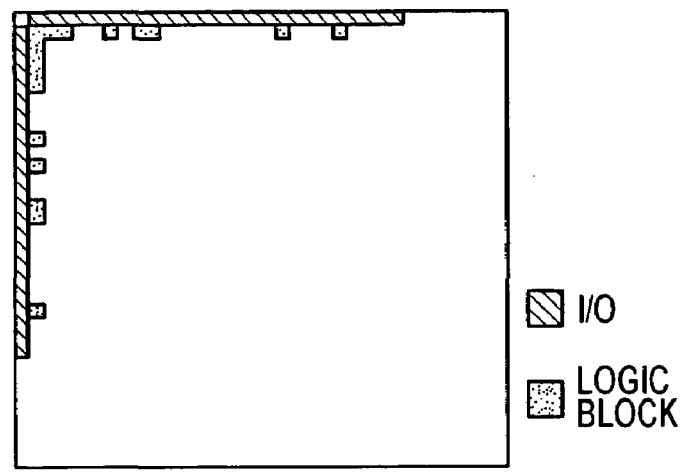

As illustrated in the FIG. 11 the I/O spread them in the design and then the SA gets trapped in local minima yielding a result very far from the optimal. Using RS in the FIG. 12 the solution space is restricted and a solution closer to the global optima is obtained.

Figure 13:
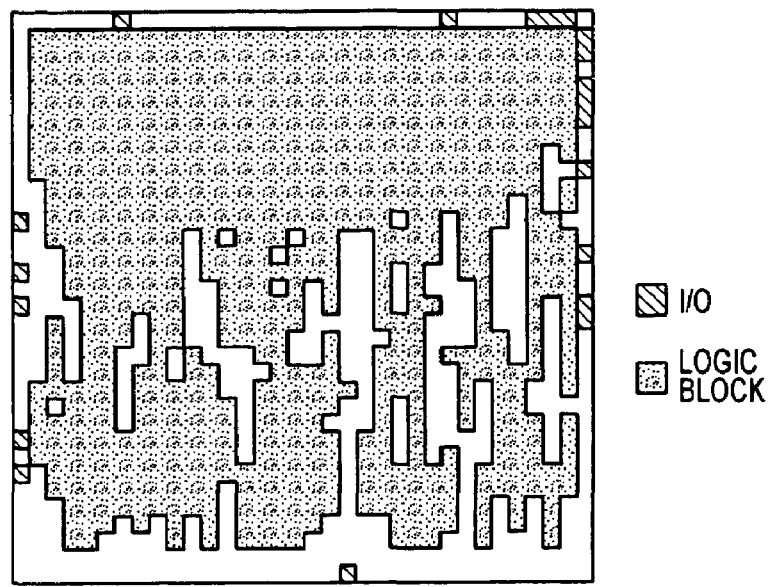

Providing more silicon area virtually is very fruitful for designs similar to the ones shown in FIG. 13. In these designs, during the annealing there are a number of moves in which two cells are swapped since there is much less vacant area. To handle such designs the designs are spread over the required silicon area (virtual since it will be more than the device size) and then annealing is started. The free silicon area will increase the number of moves in which only one cell is involved during the initial passes thus yielding a high quality intermediate solution.

Due to bad placement of very large designs the router may not be able to route the design on a given device. The reduced silicon area approach can map a big design in a much better way. Hence it may map even those designs that are not mapped by SA without reduced silicon on the same device. The placement apparatus searches only the appropriate solution space applicable for the design. Hence, unnecessary solution space is not explored. Various embodiments provide the following benefits over existing methods:
  Reduction in randomness of SA.
  Reduction in mapping time.
  Preventing SA from getting trapped in local minima resulting in wastage of Silicon area.

Further, since only the required area of silicon is used for a design, it assists in:
  Reduction in the number of routing resources required.
  Reduction in the delay in the design.
  Reduction in the routing execution time.

Since the silicon area is restricted, the maximum deviation of the results is also decreased. Thus, the consistency of the invention is increased, as further illustrated in the tables listed below:

TABLE I

Calculation of RS

| Design | I/O | RLB | Macro | L | I | M | $L_m$(L.2) | $I_m$ | Mm | RS |
|---|---|---|---|---|---|---|---|---|---|---|
| abt | 100 | 16 | 0 | 4 | 25 | 0 | 8 | 25 | 0 | 25 |
| add8 | 28 | 7 | 1 | 3 | 7 | 5 | 6 | 7 | 6 | 7 |
| add16 | 52 | 13 | 1 | 4 | 13 | 9 | 8 | 13 | 11 | 13 |
| add32 | 100 | 25 | 1 | 5 | 25 | 17 | 10 | 25 | 21 | 25 |
| addrgen | 94 | 154 | 4 | 13 | 24 | 17 | 26 | 24 | 21 | 26 |
| booth | 26 | 50 | 2 | 8 | 7 | 4 | 16 | 7 | 5 | 16 |
| ciu_alua | 119 | 119 | 0 | 11 | 30 | 0 | 22 | 30 | 0 | 30 |
| de_interleaver | 196 | 100 | 0 | 10 | 49 | 0 | 20 | 34 | 0 | 34 |
| decoder128 | 135 | 36 | 0 | 6 | 34 | 0 | 12 | 34 | 0 | 34 |
| FFT_butterfly | 240 | 192 | 8 | 14 | 60 | 8 | 28 | 34 | 24 | 34 |

TABLE I-continued

Calculation of RS

| Design | I/O | RLB | Macro | L | I | M | $L_m(I,2)$ | $I_m$ | $M_m$ | RS |
|---|---|---|---|---|---|---|---|---|---|---|
| FFT_sm1 | 17 | 67 | 0 | 9 | 5 | 0 | 18 | 5 | 0 | 18 |
| iso_main | 175 | 109 | 0 | 11 | 44 | 0 | 22 | 34 | 0 | 34 |
| XorMux8 | 54 | 204 | 0 | 15 | 14 | 0 | 30 | 14 | 0 | 30 |
| XorMux16 | 80 | 408 | 0 | 21 | 20 | 0 | 42 | 20 | 0 | 42 |

In prior art, the FPGA device size used to map a design is 34 which uses a 34×34 size FPGA array as an initial square arrangement for the mapping systems, while Table 1 shows the required FPGA device size determined using the instant invention for initial mapping. If the value of I exceeds 34, then $I_m$ is taken as Minimum (I, device Size (34)). The value of compensation factor w is taken as 2. The placement costs for various device sizes used in the mapping system are given in Table 2. As shown in Table 2, below, the highlighted values illustrate the mapping cost for the instant invention. This clearly shows some advantages of the current embodiments over the prior art in terms of placement cost.

While there have been described above the principles of the present invention in conjunction with specific components, circuitry and techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. Applicant hereby reserves the right to formulate new claims to such features and/or combinations of such features during the prosecution of the present application or of any further application derived therefrom.

TABLE 2

MST COST for Various Device Sizes (Required Silicon Values in Bold)

| Device Size | abt | add8 | add16 | add32 | addrgen | booth | ciu_alua | de_interleaver |
|---|---|---|---|---|---|---|---|---|
| 5 | NA | NA | NA | NA | NA | NA | NA | NA |
| 6 | NA | NA | NA | NA | NA | NA | NA | NA |
| 7 | NA | 110 | NA | NA | NA | NA | NA | NA |
| 8 | NA | 125 | NA | NA | NA | NA | NA | NA |
| 9 | NA | 139 | NA | NA | NA | 1106 | NA | NA |
| 10 | NA | 142 | NA | NA | NA | 1123 | NA | NA |
| 11 | NA | 151 | NA | NA | NA | 1217 | NA | NA |
| 12 | NA | 140 | NA | NA | NA | 1596 | NA | NA |
| 13 | NA | 157 | 360 | NA | NA | 1499 | NA | NA |
| 14 | NA | 168 | 394 | NA | NA | 1203 | NA | NA |
| 15 | NA | 343 | 419 | NA | NA | 1245 | NA | NA |
| 16 | NA | 182 | 419 | NA | NA | 1152 | NA | NA |
| 17 | NA | 224 | 440 | NA | NA | 1195 | NA | NA |
| 18 | NA | 221 | 702 | NA | NA | 1176 | NA | NA |
| 19 | NA | 254 | 469 | NA | NA | 1086 | NA | NA |
| 20 | NA | 187 | 512 | NA | NA | 2252 | NA | NA |
| 21 | NA | 186 | 536 | NA | NA | 2840 | NA | NA |
| 22 | NA | 226 | 573 | NA | NA | 1190 | NA | NA |
| 23 | NA | 239 | 1043 | NA | NA | 1315 | NA | NA |
| 24 | NA | 239 | 625 | NA | 2636 | 2783 | NA | NA |
| 25 | 548 | 550 | 599 | 1465 | 2786 | 2847 | NA | NA |
| 26 | 564 | 238 | 730 | 1475 | 2645 | 1198 | NA | NA |
| 27 | 571 | 325 | 680 | 1502 | 2819 | 1405 | NA | NA |
| 28 | 589 | 245 | 626 | 1564 | 7036 | 1492 | NA | NA |
| 29 | 593 | 430 | 745 | 1630 | 8594 | 1409 | NA | NA |
| 30 | 591 | 394 | 708 | 1634 | 2843 | 1261 | 3272 | NA |
| 31 | 642 | 239 | 967 | 1640 | 2647 | 2850 | 3367 | NA |
| 32 | 625 | 202 | 761 | 1716 | 2816 | 1256 | 3467 | NA |
| 33 | 618 | 202 | 775 | 1749 | 2899 | 4365 | 3747 | NA |
| 34 | 646 | 339 | 829 | 1891 | 9077 | 2936 | 3614 | 5484 |
| 35 | 659 | 282 | 958 | 1809 | 9195 | 1026 | 3448 | 5556 |
| 36 | 685 | 408 | 794 | 1972 | 2633 | 3107 | 3471 | 5658 |
| 37 | 711 | 304 | 867 | 2040 | 10070 | 1488 | 3492 | 5782 |

TABLE 2-continued

MST COST for Various Device Sizes (Required Silicon Values in Bold)

| | | | | | | | |
|---|---|---|---|---|---|---|---|
| 38 | 660 | 776 | 1669 | 1872 | 8225 | 1382 | 3622 | 5833 |
| 39 | 687 | 210 | 748 | 1930 | 9470 | 1299 | 3568 | 5939 |
| 40 | 623 | 266 | 929 | 2164 | 6727 | 1596 | 3625 | 6040 |
| 41 | 608 | 218 | 723 | 1881 | 10401 | 1171 | 3464 | 6015 |
| 42 | 628 | 400 | 702 | 2132 | 6081 | 1643 | 3474 | 6231 |
| 43 | 673 | 232 | 1056 | 2300 | 10145 | 4039 | 3731 | 6321 |
| 44 | 594 | 204 | 659 | 2036 | 12054 | 1548 | 3519 | 6382 |
| 45 | 618 | 519 | 1078 | 2091 | 3101 | 1724 | 4187 | 6373 |
| 46 | 739 | 253 | 664 | 2106 | 3311 | 3943 | 4237 | 6602 |
| 47 | 618 | 411 | 785 | 2793 | 12726 | 1374 | 3606 | 6588 |
| 48 | 735 | 298 | 1253 | 2150 | 12807 | 1263 | 3615 | 6752 |
| 49 | 634 | 1100 | 989 | 2678 | 3177 | 4778 | 3524 | 6572 |
| 0 | 687 | 200 | 1136 | 2343 | 3244 | 1553 | 3539 | 6877 |

| Device Size | decoder128 | FFT_butterfly | FFT_sm1 | iso_main | XorMux8 | XorMux16 |
|---|---|---|---|---|---|---|
| 5 | NA | NA | NA | NA | NA | NA |
| 6 | NA | NA | NA | NA | NA | NA |
| 7 | NA | NA | NA | NA | NA | NA |
| 8 | NA | NA | NA | NA | NA | NA |
| 9 | NA | NA | 1172 | NA | NA | NA |
| 10 | NA | NA | 1155 | NA | NA | NA |
| 11 | NA | NA | 1150 | NA | NA | NA |
| 12 | NA | NA | 1149 | NA | NA | NA |
| 13 | NA | NA | 1100 | NA | NA | NA |
| 14 | NA | NA | 1090 | NA | NA | NA |
| 15 | NA | NA | 1079 | NA | 4354 | NA |
| 16 | NA | NA | 1032 | NA | 4352 | NA |
| 17 | NA | NA | 1030 | NA | 4205 | NA |
| 18 | NA | NA | 1012 | NA | 4148 | NA |
| 19 | NA | NA | 1029 | NA | 4176 | NA |
| 20 | NA | NA | 1007 | NA | 4107 | NA |
| 21 | NA | NA | 1021 | NA | 4140 | 8912 |
| 22 | NA | NA | 1010 | NA | 4039 | 8891 |
| 23 | NA | NA | 1023 | NA | 3977 | 8988 |
| 24 | NA | NA | 1012 | NA | 4008 | 8826 |
| 25 | NA | NA | 1027 | NA | 3973 | 8589 |
| 26 | NA | NA | 1026 | NA | 3846 | 8467 |
| 27 | NA | NA | 1014 | NA | 3932 | 8343 |
| 28 | NA | NA | 1042 | NA | 3973 | 8259 |
| 29 | NA | NA | 1002 | NA | 3901 | 8139 |
| 30 | NA | NA | 1017 | NA | 3820 | 8221 |
| 31 | NA | NA | 1034 | NA | 3880 | 8020 |
| 32 | NA | NA | 1021 | NA | 3785 | 7973 |
| 33 | NA | NA | 1009 | NA | 3768 | 8080 |
| 34 | 875 | 9990 | 1006 | 4301 | 3872 | 8036 |
| 35 | 906 | 11710 | 1016 | 4525 | 3886 | 7862 |
| 36 | 905 | 11990 | 1046 | 4553 | 3908 | 7841 |
| 37 | 923 | 12255 | 1010 | 4715 | 3794 | 7848 |
| 38 | 973 | 11260 | 1053 | 4541 | 3791 | 8029 |
| 39 | 936 | 13317 | 1013 | 4766 | 3825 | 7808 |
| 40 | 983 | 12234 | 1005 | 4931 | 3770 | 8012 |
| 41 | 984 | 13006 | 1064 | 4944 | 3867 | 7828 |
| 42 | 987 | 13499 | 1001 | 4689 | 4122 | 7678 |
| 43 | 1036 | 13062 | 1007 | 5233 | 3996 | 7698 |
| 44 | 1045 | 11920 | 1018 | 5111 | 3704 | 7694 |
| 45 | 1013 | 11766 | 1043 | 5249 | 3767 | 7787 |
| 46 | 1017 | 10750 | 1002 | 4934 | 3804 | 7840 |
| 47 | 1051 | 11836 | 1008 | 4964 | 3765 | 7787 |
| 48 | 1110 | 11385 | 1071 | 5363 | 3763 | 7870 |
| 49 | 1148 | 12798 | 1039 | 5318 | 3872 | 8085 |
| 0 | 1124 | 13002 | 1044 | 5008 | 3901 | 8062 |

We claim:

1. A computer-implemented method for determining value of required Silicon area on a Field Programmable Gate Array (FPGA) to map a logic design, the method comprising:

determining a required Silicon area for logic blocks in the logic design by calculating the square root of the number of logic blocks in the logic design;

determining a required Silicon area for input and output cells in the logic design by dividing the number of input and output blocks in the logic design by two;

determining a required Silicon area for macros in the logic design by selecting the highest value of a maximum height or a maximum width of the macros in the logic design;

adjusting said determined required Silicon area for logic blocks, for input and output cells, and for macros in order to reduce an amount of time it will take to map the logic design onto the FPGA; and selecting the highest value of said adjusted required Silicon area for logic blocks, said adjusted Silicon area for input and output cells, and said adjusted Silicon area for macros as the value of required Silicon area; and mapping the logic design using the selected value of required Silicon area.

2. The method as recited in claim 1, further comprising readjusting said value of required Silicon area by:

determining a legalization value for macros by executing a legalization algorithm to find the minimum amount of silicon required to place all of the macros in the logic design without legalization;

determining a readjusted value for input and output cells by selecting the lesser of the adjusted Silicon area for input and output cells and the size of the FPGA; and selecting the highest of the value of required Silicon area, the legalization value for macros, and the readjusted value for input and output cells, as the readjusted value of required Silicon area.

3. The method as recited in claim 1, wherein the value of required Silicon area is less than the FPGA's area.

4. The method as recited in claim 1, wherein adjusting said determined required Silicon area for logic blocks comprises multiplying said determined required Silicon area for logic blocks by a value between 1.5 and 3.

5. The method as recited in claim 1, wherein adjusting said determined required Silicon area for input and output cells comprises multiplying said determined required Silicon area for input and output cells by a value of 1.2.

6. The method as recited in claim 1, wherein adjusting said determined required Silicon area for macros comprises multiplying said determined required Silicon area for macros by a value of 1.2.

7. The method as recited in claim 1, wherein adjusting said determined required Silicon area for logic blocks comprises multiplying said determined required Silicon area for logic blocks by a value between 1.5 and 3, wherein adjusting said determined required Silicon area for input and output cells comprises multiplying said determined required Silicon area for input and output cells by a value of 1.2, and wherein adjusting said determined required Silicon area for macros comprises multiplying said determined required Silicon area for macros by a value of 1.2.

8. The method as recited in claim 1, wherein adjusting said determined required Silicon area for logic blocks comprises multiplying said determined required Silicon area for logic blocks by a value between 1.5 and 3, wherein adjusting said determined required Silicon area for input and output cells comprises multiplying said determined required Silicon area for input and output cells by a value of 1.2, and wherein adjusting said determined required Silicon area for macros comprises multiplying said determined required Silicon area for macros by a value of 1.

9. A system for determining a value of required Silicon area on a Field Programmable Gate Array (FPGA) to map a logic design, the system comprising:

means for determining a required Silicon area for logic blocks in the logic design by calculating the square root of the number of logic blocks in the logic design;

means for determining a required Silicon area for input and output cells in the logic design by dividing the number of input and output blocks in the logic design by two;

means for determining a required Silicon area for macros in the logic design by selecting the highest value of a maximum height or a maximum width of the macros in the logic design;

means for adjusting said determined required Silicon area for logic blocks, for input and output cells, and for macros in order to reduce an amount of time it will take to map the logic design onto the FPGA; and means for selecting the highest value of said adjusted required Silicon area for logic blocks, said adjusted Silicon area for input and output cells, and said adjusted Silicon area for macros as the value of required Silicon area.

10. The system as recited in claim 9, further comprising readjusting said value of required Silicon area by:

means for determining a legalization value for macros by executing a legalization algorithm to find the minimum amount of silicon required to place all of the macros in the logic design without legalization;

means for determining a readjusted value for input and output cells by selecting the lesser of the adjusted Silicon area for input and output cells and the size of the FPGA; and means for selecting the highest of the value of required Silicon area, the legalization value for macros, and the readjusted value for input and output cells, as the readjusted value of required Silicon area.

11. The system as recited in claim 9, wherein the value of required Silicon area is less than the FPGA's area.

12. The system as recited in claim 9, wherein adjusting said determined required Silicon area for logic blocks comprises means for multiplying said determined required Silicon area for logic blocks by a value between 1.5 and 3.

13. The system as recited in claim 9, wherein adjusting said determined required Silicon area for input and output cells comprises means for multiplying said determined required Silicon area for input and output cells by a value of 1.2.

14. The system as recited in claim 9, wherein adjusting said determined required Silicon area for macros comprises means for multiplying said determined required Silicon area for macros by a value of 1.2.

15. The system as recited in claim 9, wherein adjusting said determined required Silicon area for logic blocks comprises means for multiplying said determined required Silicon area for logic blocks by a value between 1.5 and 3, wherein adjusting said determined required Silicon area for input and output cells comprises multiplying said determined required Silicon area for input and output cells by a value of 1.2, and wherein adjusting said determined required Silicon area for macros comprises multiplying said determined required Silicon area for macros by a value of 1.2.

16. A mapping system configured to:

determine a required Silicon area for logic blocks in the logic design by calculating the square root of the number of logic blocks in the logic design;

determine a required Silicon area for input and output cells in the logic design by dividing the number of input and output blocks in the logic design by two;

determine a required Silicon area for macros in the logic design by selecting the highest value of a maximum height or a maximum width of the macros in the logic design;

adjust said determined required Silicon area for logic blocks, for input and output cells, and for macros in order to reduce an amount of time it will take to map the logic design onto the FPGA; and select the highest value of said adjusted required Silicon area for logic blocks, said adjusted Silicon area for input and output cells, and said adjusted Silicon area for macros as a value of required Silicon area.

17. The mapping system as recited in claim 16, further comprising readjusting said value of required Silicon area by:

determining a legalization value for macros by executing a legalization algorithm to find the minimum amount of silicon required to place all of the macros in the logic design without legalization;

determining a readjusted value for input and output cells by selecting the lesser of the adjusted Silicon area for input and output cells and the size of the FPGA; and selecting the highest of the value of required Silicon area, the legalization value for macros, and the readjusted value for input and output cells, as the readjusted value of required Silicon area.

18. The mapping system as recited in claim 16, wherein the value of required Silicon area is less than the FPGA's area.

19. The mapping system as recited in claim 16, wherein adjusting said determined required Silicon area for logic blocks comprises multiplying said determined required Silicon area for logic blocks by a value between 1.5 and 3.

20. The mapping system as recited in claim 16, wherein adjusting said determined required Silicon area for input and output cells comprises multiplying said determined required Silicon area for input and output cells by a value of 1.2.

21. The mapping system as recited in claim 16, wherein adjusting said determined required Silicon area for macros comprises multiplying said determined required Silicon area for macros by a value of 1.2.

22. The mapping system as recited in claim 16, wherein adjusting said determined required Silicon area for logic blocks comprises multiplying said determined required Silicon area for logic blocks by a value between 1.5 and 3, wherein adjusting said determined required Silicon area for input and output cells comprises multiplying said determined required Silicon area for input and output cells by a value of 1.2, and wherein adjusting said determined required Silicon area for macros comprises multiplying said determined required Silicon area for macros by a value of 1.2.

* * * * *